(12) United States Patent
Sahm

(10) Patent No.: US 6,665,368 B2
(45) Date of Patent: Dec. 16, 2003

(54) APPARATUS AND METHOD FOR INCREASING THE MAXIMUM INPUT FREQUENCY OF A FREQUENCY DIVIDER

(75) Inventor: Peter H. Sahm, Spring Grove, IL (US)

(73) Assignee: Northrop Grumman, Los Angeles, CA (US)

( * ) Notice: Subject to any disclaimer, the term of this patent is extended or adjusted under 35 U.S.C. 154(b) by 174 days.

(21) Appl. No.: 09/939,103

(22) Filed: Aug. 24, 2001

(65) Prior Publication Data

US 2003/0048866 A1 Mar. 13, 2003

(51) Int. Cl.⁷ ............................................. H03K 21/00
(52) U.S. Cl. ......................... 377/47; 327/115; 327/117
(58) Field of Search ........................... 377/47; 327/115, 327/117

(56) References Cited

U.S. PATENT DOCUMENTS

| | | | |
|---|---|---|---|
| 3,832,652 A | | 8/1974 | Lakshiminarasimha |
| 3,943,460 A | | 3/1976 | Arai |
| 4,357,580 A | | 11/1982 | Mawhinney |
| 4,721,905 A | * | 1/1988 | Mehrgardt ................ 324/83 D |
| 5,517,638 A | * | 5/1996 | Szczepanek ................ 395/550 |
| 6,020,790 A | | 2/2000 | Jackson |
| 6,323,991 B2 | * | 11/2001 | Cisternino et al. .......... 359/329 |

OTHER PUBLICATIONS

Stubbs et al., "A Single Stage Monolithic Regenerative 1/2 Analog Frequency Divider", 1996, Department of Communication, Communications Research Centre, pp. 1999–201.*

M.G. Stabbs & S.P. Stapleton, A Single Stage Monlithic Regenerative 1/2 Analog Frequency Divider, 1996, pp. 199–201, Department of Communication, Communications Research Centre, 3701 Carling Avenue, Ottawa, Ontario

* cited by examiner

Primary Examiner—Margaret R. Wambach
(74) Attorney, Agent, or Firm—Stetina Brunda Garred & Brucker

(57) ABSTRACT

An apparatus and associated method is disclosed for increasing the maximum input frequency of a frequency divider system by altering the division ratio in the frequency divider system. In an exemplary form, the apparatus includes an electrical mixer circuit to combine an internal and an external frequency input signals into a combination frequency signal and a frequency divider circuit to receive the combination frequency signal and to frequency divide the combination frequency signal by a predetermined number, a signal splitter and a directional coupler in operative to receive the divided frequency signal and to generate an output frequency signal and a feedback frequency signal wherein the feedback frequency signal is identical in frequency to the output frequency signal and becomes the internally inputted frequency signal for the mixer. In this way the maximum input frequency of the frequency divider system can be advantageously increased.

17 Claims, 4 Drawing Sheets

5. EXAMPLE OF NESTED CIRCUIT ÷2 BECOMES ÷3 IN FIRST LOOP
÷3 BECOMES ÷4 IN SECOND LOOP

APPARATUS AND METHOD FOR INCREASING THE MAXIMUM INPUT FREQUENCY OF A FREQUENCY DIVIDER

CROSS-REFERENCE TO RELATED APPLICATIONS (Not Applicable)

STATEMENT RE: FEDERALLY SPONSORED RESEARCH/DEVELOPMENT (Not Applicable)

FIELD OF THE INVENTION

The present invention is generally directed to frequency dividers. More particularly, the present invention is directed to increasing the maximum input frequency of a frequency divider.

BACKGROUND OF THE INVENTION

The division of frequency in operations of the electronic circuitry has long been known in the art. Presently, a number of electronic circuitry utilize various frequency division methods and formulas, such as direct frequency division using conventional flip-flop circuitry, to transmit and alter the output frequencies of various electronic devices.

These devices, however, are not without shortcomings. Existing frequency dividers are each limited to a predetermined maximum input frequency which can be received by the divider while performing any frequency division task. This limitation is in part due to topology used to design the component as well as each device being limited to a predetermined integral division ratio number, such as integer 2, by which it divides its received frequencies. The foregoing shortcomings in the existing frequency dividers generally undesirably limits the operation of the devices which utilize an existing divider by lowering the maximum frequency which can be inputted into the device.

Currently, one method of minimizing this limitation is in the use of multiple dividers. In this approach, multiple dividers are operatively connected to each other to virtually aggregate the maximum input frequency of each divider into an overall multiple divider combination having increased maximum input frequency. This allows for the overall multiple divider combination to accommodate a signal whose frequency is greater than the frequency of each individual divider. This solution however, is less than favorable because of the inherent disadvantages associated with the use of multiple divider. The use of multiple dividers adds to the complexity, size and associated cost in the manufacturing of the underlying device. In addition, use of multiple dividers undesirably increases signal noise and reduces the speed of operations due to increased number of circuitry, which in turn increases the overall processing time of the underlying device. Furthermore, power consumption is unfavorably increased resulting in reduced efficiency in power consumption and other associated problems such as additional thermal dissipation that can increase the noise levels in the processed signal. Finally, the addition of extra dividers at a later post manufacturing stage may not be possible, especially if the entire circuit layout is embedded on a microchip.

It is therefore an object of the present invention to provide an electronic a device that can advantageously increase the frequency inputted into a frequency divider device during any frequency division task.

It is another object of the present invention to provide an electronic a device that can convert the divider ratio from an even ratio to an odd ratio, or from an odd ratio to an even ratio during any frequency division task, in a manner that would increase the overall maximum frequency inputted into the device.

SUMMARY OF THE INVENTION

These and other objects are achieved by the various apparatus and associated methods of the present invention.

In a broad aspect, the present invention provides a novel apparatus for increasing the maximum input frequency of a frequency divider. The apparatus includes a frequency mixer circuit to receive as input a first input frequency signal, a second input frequency signal and to generate a combination signal wherein the combination is a frequency subtraction of the second input frequency signal from the first input frequency signal, at least one frequency divider circuit in operative contact with the mixer to receive and to frequency divide the combination frequency signal by a predetermined number.

The apparatus further includes at least one of a signal splitter and a directional coupler in operative contact with the frequency divider to receive the divided frequency signal and to generate an output frequency signal and a feedback frequency signal wherein the feedback signal having a frequency identical with the output frequency signal and wherein the feedback frequency signal constitutes the second input frequency signal.

In another aspect, the present invention provides a method for increasing the maximum input frequency of a frequency divider system. The method includes communicating an input frequency signal to be frequency divided to a mixer input, communicating an output of the mixer to a frequency divider input generating an output frequency signal; and feeding the divider output frequency signal back into the mixer for combination with the input frequency signal whereby the input frequency signal and the divider output frequency signal are mixed in a frequency subtractive manner such that the mixer output to the frequency divider unit is at a lower frequency than the input signal frequency, causing the divider output frequency signal to be at a lower frequency than if the divider was connected directly to the input signal.

A more detailed understanding of these features, and of additional features, objects, and advantages of the present invention will be provided to those skilled in the art from a consideration of the following Detailed Description of the Invention, taken in conjunction with the accompanying Drawings, which will now first be described briefly.

DETAILED DESCRIPTION OF THE INVENTION

Referring more particularly to the drawings, the present invention is directed to increasing the maximum input frequency of a frequency divider system by virtually altering the division ratio in a frequency divider circuit. This is accomplished by altering the overall divider ratio from an even ratio to an odd ratio, or in the alternative, from an odd ratio to an even ratio, based on the inputted frequency and in a manner that would increase the maximum input frequency of a frequency divider system.

Figure 1:
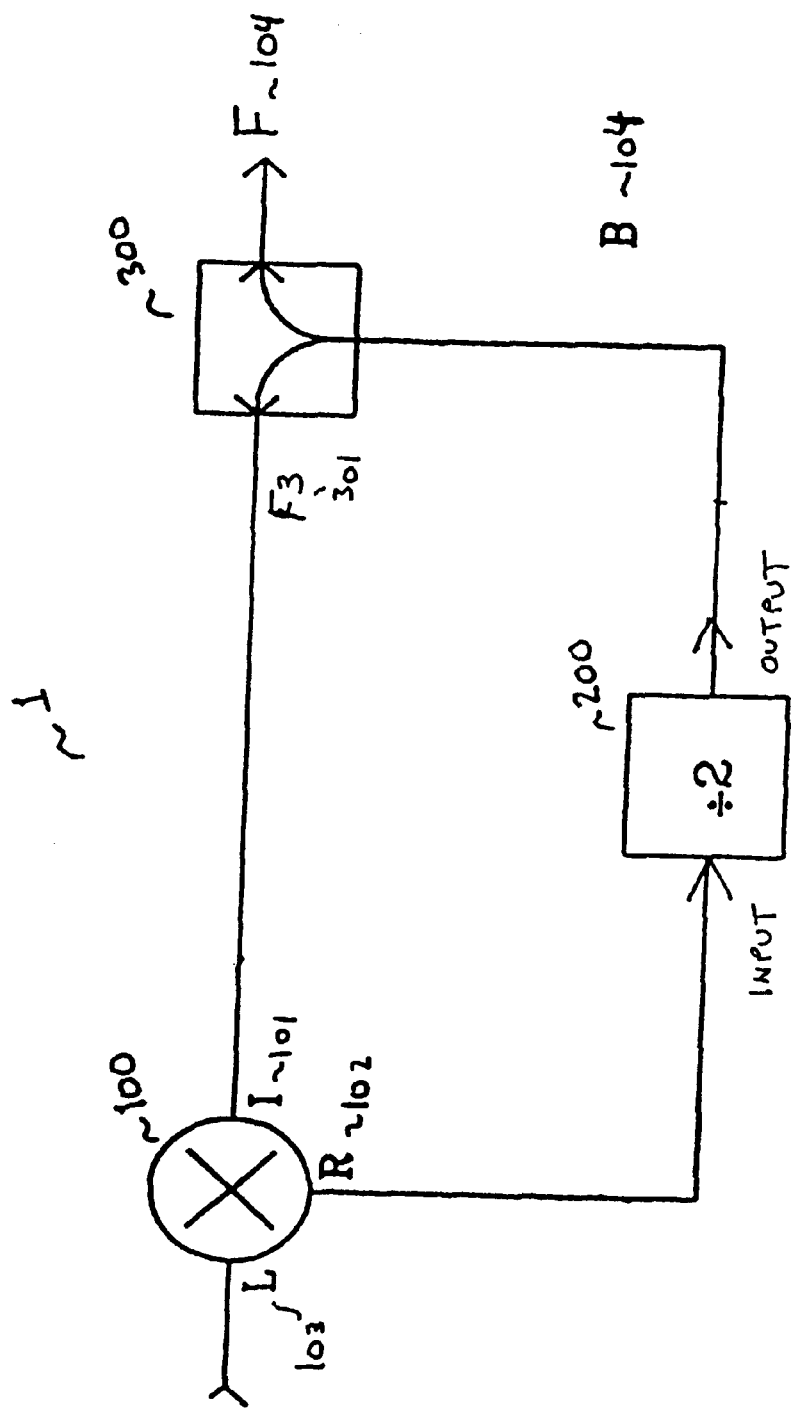
FIG. 1 is a circuit block diagram illustrating an exemplary embodiment of the present invention.

Turning now to the Drawings, FIG. 1 illustrates an exemplary embodiment of the present invention in frequency divider system 1 which includes a frequency mixer unit 100, a frequency divider unit 200 and output unit 300 connected in a nonlinear feedback loop circuit formation. As illustrated in FIG. 1 the frequency mixer unit 100 receives as input the externally provided signal having an L-input frequency 103 and the internally provided signal having I-input frequency 101 and combines the aforementioned frequencies into two combination signals each having an R-frequency 102. The mixer formula utilized by the mixer unit 100 is $R_{freq}=L_{freq}\pm I_{freq}$. Thus one $R_{freq}$ is calculated to be an addition of I-input frequency 101 to the L-input frequency 103 and the other a subtracting of L-input frequency 103 from the I-input frequency 101.

As further illustrated in FIG. 1 the combination signals are received by the frequency divider unit 200. Generally, the divider unit 200 does not respond to the combination signal having the higher R-frequency. The lower R-frequency 102 is then admitted and divided by a predetermined integral N number, such as integer 2, to form the B-signal having a divided B-frequency 104. The divided B-signal is then received by the output unit 300 and dually outputted in the form of identical signals of output signal having F-frequency 104, and feedback signal having F3-frequency 301. In an exemplary embodiment, the output unit 300 is a signal splitter or a directional coupler, which splits or duplicates the B-signal. The feedback F3-frequency 301 is then inputted in the frequency mixer unit 100 as the internally provided signal, replacing the initially inputted I-input frequency 101.

Figure 3:
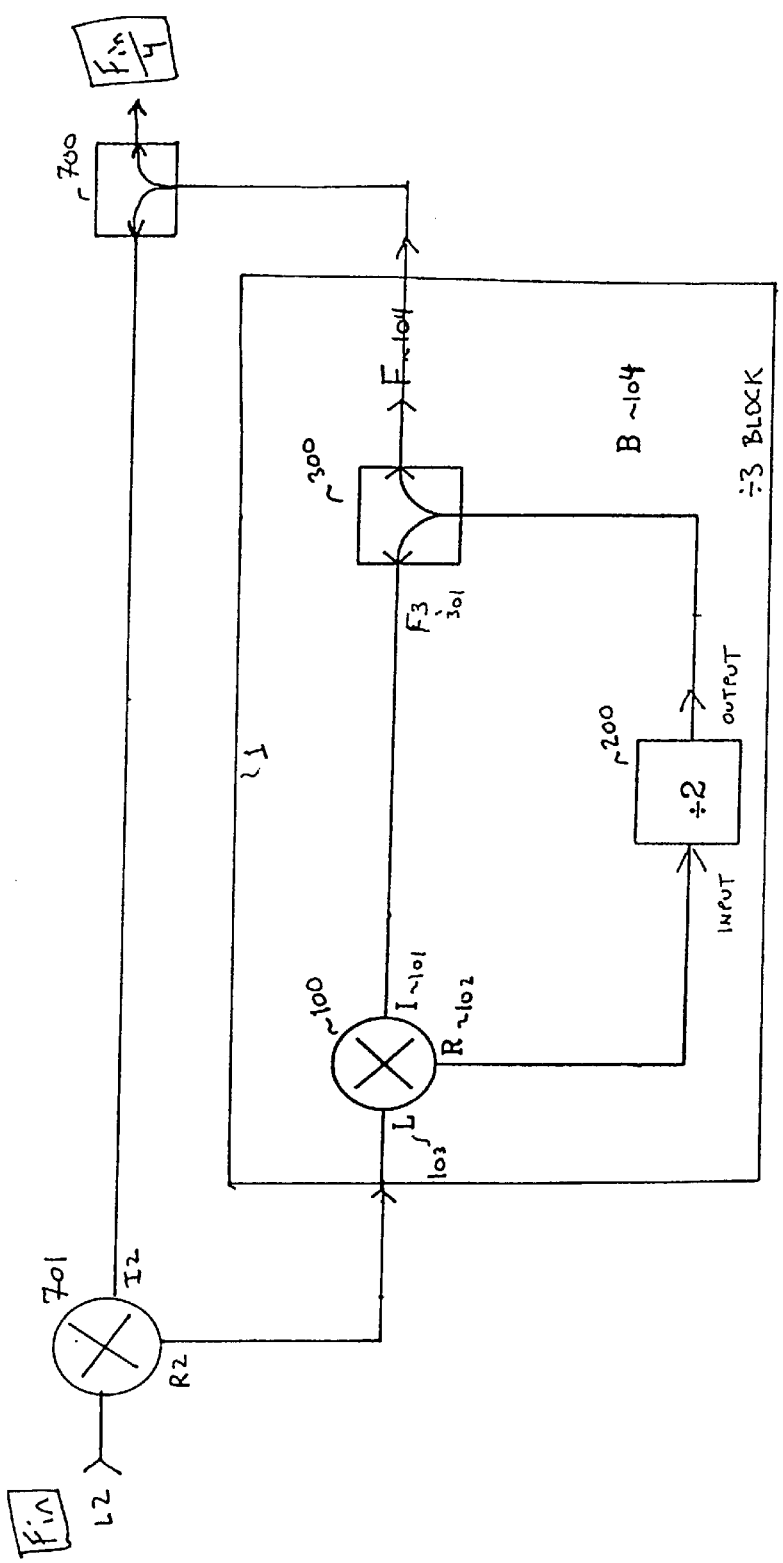
FIG. 3 is a circuit block diagram illustrating yet another exemplary embodiment of the present invention.

One advantage of the foregoing configuration of the present invention is the altering of the overall divider ratio from an even ratio to an odd ratio, or in the alternative, from an odd ratio to an even ratio, in frequency divider system 1. For example, a divide-by-2 frequency divider system can be changed to a divide-by-3 divider system. In this way the maximum input frequency may be favorably increased, such as by 50 percent without the addition of multiple divider circuits. Additionally, as shown in FIG. 3 described below, the foregoing configuration may be nested to further increase the divider ratios, thus further extending the high frequency operations of the circuit.

In an exemplary embodiment, the frequency mixer unit 100 is a frequency mixer circuit such as a Watkins-Johnson mixer. Also in the exemplary embodiment, the frequency divider unit 200 is a Northrop Grumman-designed divide-by-2 divider integrated circuit mounted in a test fixture module with coaxial SMA coax connectors, and connected to a Narda directional coupler with co-axial cables, to form the circuit. The frequency divider system 1 has an input frequency capability greater than 9 GHz, which also functions as a limiting input frequency filter. In another exemplary embodiment of the present invention, the mixer unit 100 is integrated on the same microchip as the divider unit 200 to reduce the overall size of the frequency divider system 1.

Figure 2:
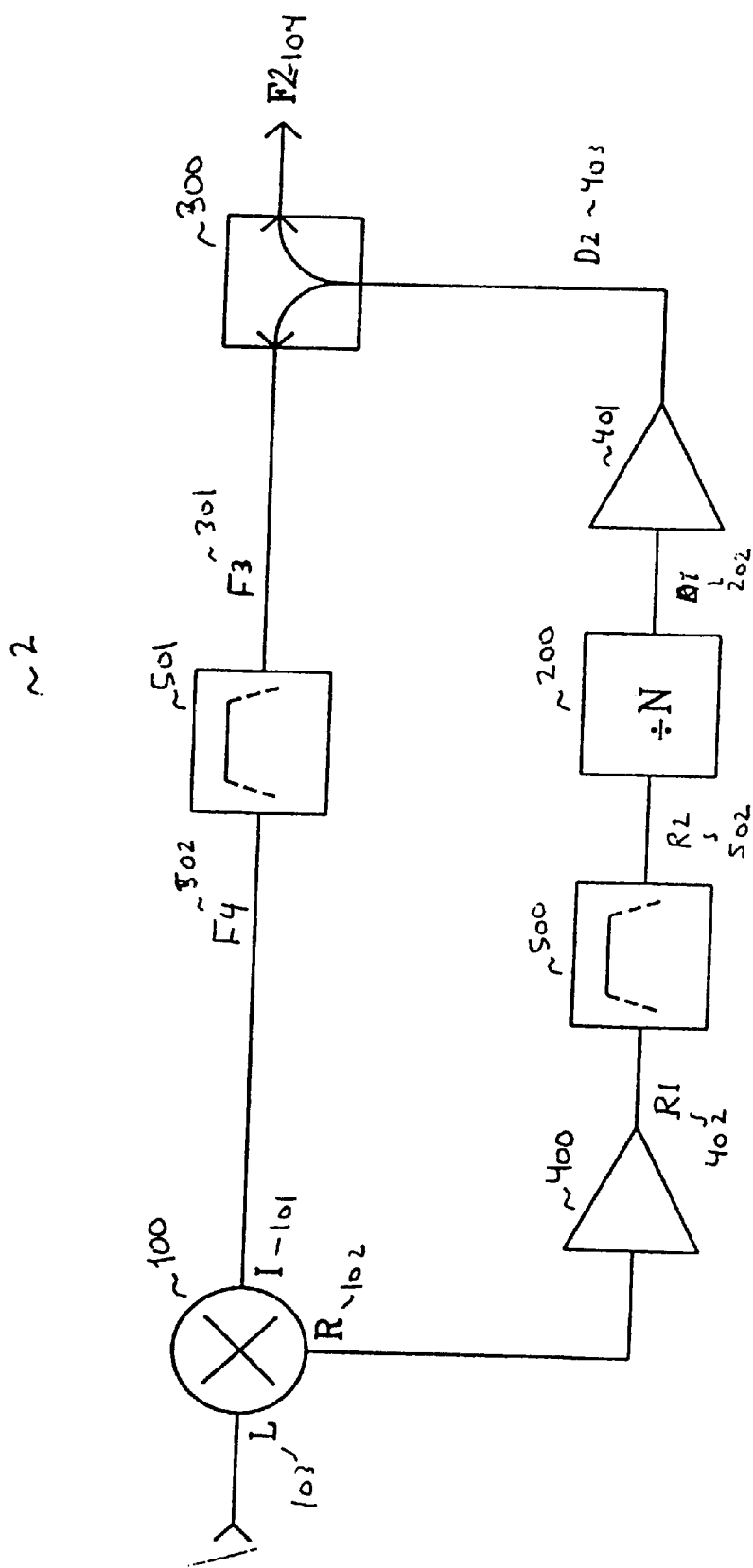
FIG. 2 is a circuit block diagram illustrating another exemplary embodiment of the present invention.

FIG. 2 illustrates another exemplary embodiment of the present invention in frequency divider system 2. The divider 2 shares the same common components with the frequency divider system 1 of FIG.1, but with the additional components of amplifier unit 400, filter unit 500, amplifier unit 401 and filter unit 501.

As illustrated in FIG. 2, filter unit 400 receives the two combination signal having R-frequency 102 and filters out the higher R-frequency and other undesired frequency harmonics or signals outputted from the frequency mixer unit 100. The filtered R1 signal 402 which is the lower R-frequency 102 is then inputted into amplifier unit 500 prior to being inputted into the frequency divider unit 200 at where the R-frequency 102 is divided by a predetermined integral number N, such as integer 2, to form the D1-signal having a divided D1-frequency 202. The divided D1-signal is then received by the amplifier unit 401 and amplified to form D2-signal having a divided amplified D2-frequency 403, which is then dually outputted by the output unit 300 in form of identical signals of output signal having F2-frequency 104, and feedback signal having F3-frequency 301. In an exemplary embodiment, the output unit 300 is a signal splitter or a directional coupler, which splits or duplicates the B-signal. The feedback F3-frequency 301 is then inputted into the filter unit 501 for filtering of the higher order harmonics from the output of the frequency divider unit 200. The filtered F4-signal 502 is then inputted in the frequency mixer unit 100 as the internally provided signal, replacing the initially inputted I-input frequency 101. Filter 501 also advantageously limits the number of frequency components inputted into the mixer to one, namely the F4-signal.

It should be noted that the amplifier units 500 and 501 are not essential to the overall operations of the present invention if the input sensitivity and output power of the frequency divider unit 200 can provide sufficient gain in the feedback loop. Additionally, filter unit 500 is not essential to the overall operations of the present invention if the frequency divider unit 200 has a natural input frequency limited response.

FIG. 3 illustrates yet another embodiment of the present invention in which the configuration illustrated in FIG. 1 is nested to further increase the divider ratios, thus further extending the high frequency operations of the circuit. As shown, the addition of mixer 701 and the signal splitter 700 to the divider system 1 will further increase the overall division ratio of the overall circuit by an additional integer. For example, if the divider unit 200 in FIG. 3 had a division ratio of 2, the divider system 1 will have a division ratio of 3(2+1) and the overall nested circuit will have a division of 4(3+1). It should be noted that the nested approach can also be readily incorporated with the embodiment illustrated in FIG. 2.

In the exemplary embodiments of the present invention as illustrated in FIG. 1, FIG. 2 and FIG. 3, circuit operation requires a sufficiently large input signal applied at the external input port of the mixer at frequency L to enable proper mixer at frequency L to enable proper mixer operation. Any signal at the internal port, at frequency I, will be combined through the mixer to frequencies R=L+I or R=L−I, such that the output signal $F_{out}$ becomes $(L\pm I)/N$. By substituting L with the input frequency $F_{req}$ and I with the output frequency $F_{out}$, two output frequencies $F_{out}$ for F-frequencies 104 $F_{freq}/(N\pm1)$ are possible and selection depends on which sideband signal present at the mixer is allowed to drive the input of the frequency divider. Selection of the lower sideband L−I results in an overall divider output frequency $F_{out}$ of $F_{freq}/(N+1)$, where N is the predetermined integral number of frequency divider unit 200. Selection of the upper sideband L+I results in an overall output frequency $F_{out}$ of $F_{freq}/(N-1)$. The filtering function of filter unit 500 is utilized to make the divider input insensitive to the unwanted mixer sideband and any residual L signal passed through the mixer.

In an exemplary embodiment of the present invention, an output signal between the mixer and the input to the divider 200 can be extracted, thus advantageously resulting in potential output signals of $N*L/(N\pm1)$. In addition, when increasing the divider ratio, maximum input frequency may be advantageously extended past the range of the frequency divider unit 200 by up to $(1/N)*100$ percent.

The key to overall circuit operation is having a signal present at the internally provided input of the mixer during start-up. This exemplary embodiment utilizes a dynamic frequency divider unit 200 in the feedback loop which has a natural internal resonant frequency of $F_{res}$ and has an output signal of $F_{res}/N$ in the absence of any input signal. At the time t=0 when the Fin signal is applied the output signal F-freq 104 is not related to the input signal L. If the mixer has sufficient input drive however, and the appropriate mixer output port sideband sufficiently triggers the input of the frequency divider in the loop, steady state operation will eventually result. Negative feedback around the loop will force the output frequency of the divider unit 200 to rapidly move towards a value which satisfies the operating loop frequency equation. It should be noted that the feedback may be considered to be occurring in the frequency domain due to the non-linear frequency combining and scaling behaviors of the mixer unit 100 and the divider circuit 200. In an alternate exemplary embodiment, a static divider circuit 200 may be utilized in place of a dynamic one in the topology if an external signal were to be injected into the loop to initiate divider operation or generate an initial internal input signal 101. One advantage of the foregoing use of a static divider circuit is the potential improvement in the phase noise behavior of the overall topology.

Figure 4:
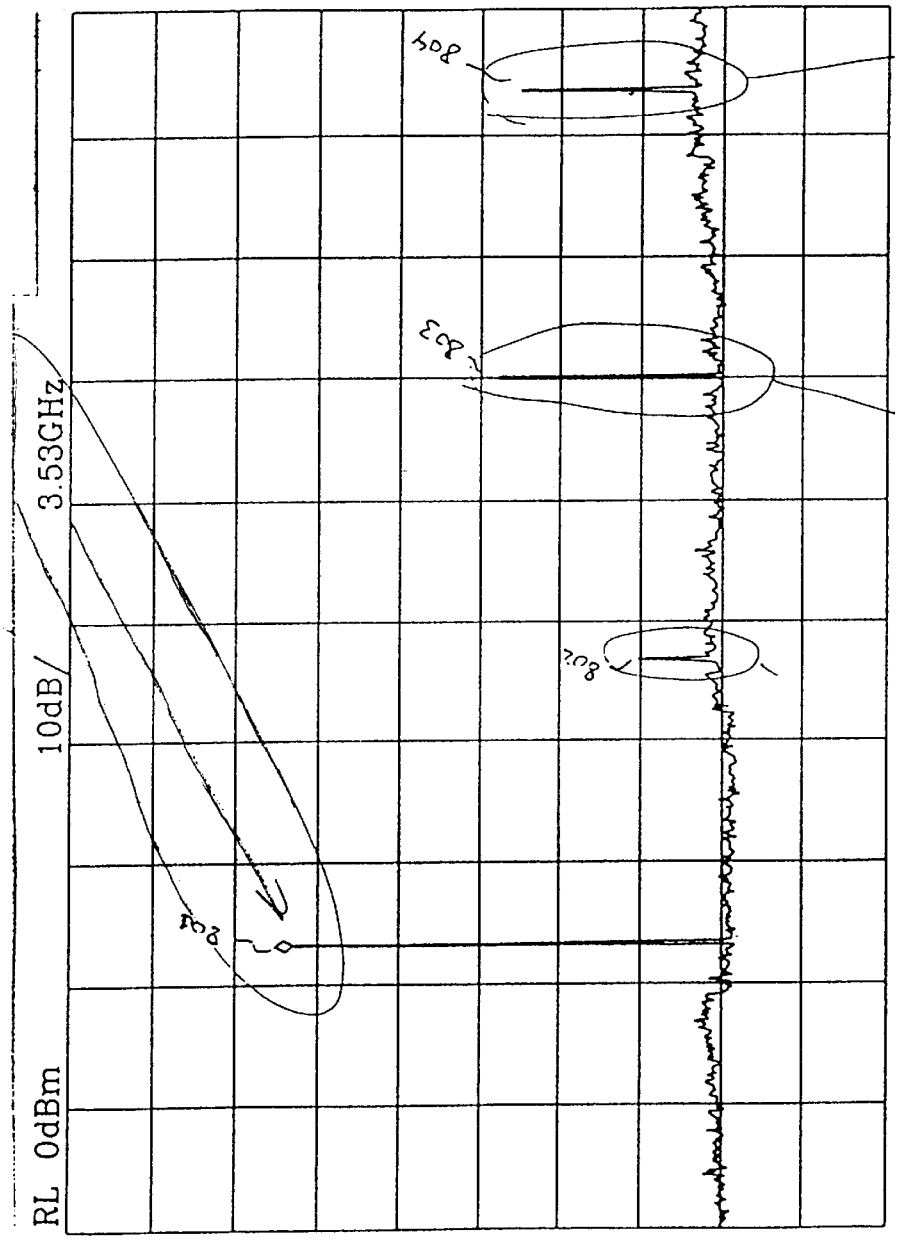
FIG. 4 is a sampled spectrum diagram illustrating the operations of the present invention.

FIG. 4 illustrates the sampled output spectrum from the directional coupler for an input signal 103 at 10.5 GHz and 10 dBm RF power. In an exemplary embodiment the primary output signal of the divider unit 200 is at 3.5 GHz, or one third of 10.5 Ghz as shown by the signal peak 801 in FIG. 3. As shown, the output signal from the divider is highly saturated and not a pure sine wave, causing the additional output harmonic levels of 802, 803 and 804, which are respectively the 2nd, 3rd and 4th multiples of the primary signal 801. In the sampled output spectrum of FIG. 4, the output signal approximates a square wave form. The overall circuit operates reliably as a divide-by-3 divider when the input signal 103 sweeps from 9 to 10.5 GHz. Operation at higher frequencies may result in a signal roll-off due to lowered gain in the output amplifier of the integrated circuit divider causing an insufficient power driving the internal input port of the mixer. Even with sufficient gain the maximum allowable input signal would be determined by the maximum internal divider input frequency (9 GHz) and the self-oscillation output frequency (4.5 GHz) for a total of 13.5 GHz (9 GHz+4.5 GHz). Thus, the self oscillation frequency sets a constraint along with the input frequency such that any mixed signal sideband produced by the mixer must be within the input range of the internal divider circuit. Operation below 9 GHz may provide potentially unreliable results due to the lack of proper filtering at the input of the integrated circuit divider. The presence of multiple input signals to the internal divider 200 can cause chaotic and unreliable divider action.

Other embodiments, features, and advantages of the present invention will be apparent to those skilled in the art from a consideration of the foregoing specification as well as through practice of the invention and alternative embodiments and methods disclosed herein. Therefore, it should be emphasized that the specification and examples are exemplary only, and that the true scope and spirit of the invention is limited only by the following claims.

What is claimed is:

1. A method for increasing the maximum input frequency of a frequency divider system, said method comprising:

communicating an input frequency signal to be frequency divided to an input of a mixer;

communicating an output of the mixer to an input of a frequency divider generating a frequency-divided output frequency signal;

feeding the frequency-divided output frequency signal back to the mixer for combination with the input frequency signal whereby the input frequency signal and the frequency-divided output frequency signal are mixed in a manner that the frequency of the frequency-divided output frequency signal is subtracted from that of the input frequency signal such that the output of the mixer to the frequency divider is at a lower frequency than the input frequency signal, causing the frequency-divided output frequency signal to be at a lower frequency than if the frequency divider was connected directly to the input frequency signal.

2. The method of claim 1 wherein the frequency of an output frequency signal after the input frequency is mixed with the frequency-divided output signal corresponds to the frequency of the input frequency signal divided by a predetermined factor wherein the predetermined factor is a predetermined number minus one, and the input frequency signal before being mixed with the frequency-divided output signal is divided by the predetermined number to derive the frequency-divided output signal.

3. The method of claim 2 wherein the predetermined number is an integer number.

4. The method of claim 1 further comprising:

filtering the said output of the mixer prior to the generating of the frequency-divided output frequency signal, wherein the filtering to reduce at least one of undesired harmonics and noise in the combination signal.

5. The method of claim 1 further comprising:

filtering the frequency-divided output frequency signal to reduce at least one of undesired harmonics and noise in the frequency divided output frequency signal.

6. The method of claim 1 wherein the input frequency signal is a microwave frequency signal.

7. An apparatus for increasing the maximum input frequency of a frequency divider, the apparatus comprising:

a frequency mixer circuit to receive as input a first input frequency signal, a second input frequency signal and to generate a combination signal wherein the combination signal is a frequency subtraction of the second input frequency signal from the first input frequency signal;

at least one frequency divider circuit in operative contact with the mixer to receive and to frequency divide the combination frequency signal by a predetermined number; and at least one of a signal splitter and a directional coupler in operative contact with the frequency divider to receive the divided frequency signal and to generate an output frequency signal and a feedback frequency signal wherein the feedback signal having a frequency identical with the output frequency signal and wherein the feedback frequency signal constitute the second input frequency signal.

8. The apparatus of claim 7 wherein the external frequency signal is a microwave frequency signal.

9. The apparatus of claim 7 wherein the frequency of the output frequency signal corresponds to the frequency of the first input frequency signal divided by a predetermined factor wherein the predetermined factor is the predetermined number minus one.

10. The apparatus of claim 7 wherein the frequency of the output frequency signal corresponds to the frequency of the first input frequency signal divided by a predetermined factor wherein the predetermined factor is the predetermined number plus one.

11. The apparatus of claim 7 further comprising:
a first filter circuit in operative contact to receive the combination frequency signal from the first amplifier and to reduce at least one of undesired harmonics and noise in the combination frequency signal and to output the signal to the divider circuit.

12. The apparatus of claim 7 further comprising:
a first filter circuit in operative contact with the at least one of the signal splitter and the directional coupler to receive the feedback frequency signal and to reduce at least one of undesired harmonics and noise in the feedback frequency signal wherein the filtered feedback frequency signal constitutes the second input frequency signal.

13. The apparatus of claim 7 wherein the predetermined number is an integer number.

14. The apparatus of claim 7 wherein the frequency divider circuit is a dynamic frequency divider circuit.

15. The apparatus of claim 7 wherein the frequency divider circuit is a static divider circuit.

16. A frequency divider system, comprising:
a mixer, operative to receive an input frequency signal of which the frequency is to be divided;
a frequency divider, coupled to an output of the mixer, the frequency divider being operative to divide the output of the mixer by a predetermined division ratio into a frequency-divided output frequency signal; and
an output unit, being operative to output the frequency-divided output frequency signal and feed the divided output frequency signal back to the mixer, such that the output of the mixer becomes a combination signal of the input frequency signal and the divided output frequency signal; wherein
the combination signal has a frequency equal to an addition of frequencies of the input frequency signal and the divided output frequency signal.

17. The frequency divider system of claim 16, wherein the combination signal has a frequency equal to a subtraction between the frequencies of the input frequency signal and the divided output frequency signal.

* * * * *